United States Patent [19]

Meyer

[11] Patent Number: 5,563,531

[45] Date of Patent: Oct. 8, 1996

[54] DIGITAL PHASE COMPARATOR

[75] Inventor: Jacques Meyer, Corenc, France

[73] Assignee: SGS-Thomson Microelectronics S.A., Saint Genis Pouilly, France

[21] Appl. No.: 306,482

[22] Filed: Sep. 15, 1994

[30] Foreign Application Priority Data

Sep. 30, 1993 [FR] France .................. 93/11864

[51] Int. Cl.⁶ ..................................... G01R 25/00
[52] U.S. Cl. ............................. 327/3; 340/146.2
[58] Field of Search ............... 327/2–3; 377/55, 377/56; 340/146.2

[56] References Cited

U.S. PATENT DOCUMENTS

| | | | |
|---|---|---|---|
| 4,351,002 | 9/1982 | Decraemer et al. | 358/158 |
| 4,654,586 | 3/1987 | Evans et al. | 324/83 |
| 4,683,495 | 7/1987 | Brock | 327/2 |
| 5,302,908 | 4/1994 | Tarusawa et al. | 328/133 |

*Primary Examiner*—Margaret R. Wambach
*Attorney, Agent, or Firm*—David M. Driscoll; James H. Morris; Richard F. Giunta

[57] ABSTRACT

A digital phase comparator supplies digital values corresponding to the phase shifts between a first signal having a duty cycle of approximately 0.5 and a second signal. The comparator includes a one-way counter initialized at the frequency of the first signal and clocked by a clock signal having a high frequency with respect to the frequency of the first and second signals. A logic gate enables the counter when the first and second signals are in respective predetermined states. A phase shift is considered to be zero when it corresponds approximately to one half of the counter's capacity.

28 Claims, 4 Drawing Sheets

DIGITAL PHASE COMPARATOR

BACKGROUND OF THE INVENTION

1. Field of the Invention

The present invention relates to phase-locked loops (PLLs), and particularly to a digital phase comparator used in an entirely digital PLL.

2. Discussion of the Related Art

FIG. 1 is a schematic diagram of a conventional PLL structure. The PLL includes a voltage-controlled oscillator (VCO) 10 providing a frequency NF to a divide-by-N counter 12. A phase comparator 14 receives the output frequency F from divider 12 and a reference frequency Fref. The phase comparator 14 provides a phase error signal e to a filter 16 whose output c controls the VCO 10. In steady state, the phase and frequency of signal F are locked on signal Fref. In common applications, for example in the horizontal scanning of a television set, the frequency F to be obtained is approximately 15 kHz, and the frequency NF is approximately 12 MHz (N=768), and filter 16 is a low-pass filter whose cut-off frequency is a few hundred hertz.

The present trend is to realize all the PLL elements in the form of digital circuits. This avoids the use of high value capacitors that are difficult to integrate, renders the elements programmable, and simplifies the design operations by allowing the use of standard blocks in MOS or CMOS technologies.

FIG. 2 represents a conventional digital phase comparator 14. The phase comparator 14 includes a phase-frequency detector (PFD) 18 receiving the signals Fref and F. The PFD 18 provides pulses UP whose widths equal the phase lags of signal F with respect to the signal Fref, and pulses DOWN whose widths equal the phase leads of signal F with respect to signal Fref. An up/down counter 20 receives a clock signal CK having a high frequency relative to the frequency of signals Fref and F. The up-counting of the up/down counter 20 is enabled by pulses UP, and the down-counting is enabled by pulses DOWN. A sequencer 22 receiving signals F and CK resets the up/down counter 20 between two edges of signal F, once its content has been processed by the filter.

With this configuration, after each pulse UP or DOWN, the up/down counter 20 stores a digital value E corresponding to the desired phase error.

The two edges of each pulse UP or DOWN correspond to an edge of signal Fref and to an edge of signal F, respectively. Accordingly, if a spurious pulse occurs before the edge to be taken into account of signal Fref or F, the pulse UP or DOWN thus generated is erroneously shortened or lengthened. Such a phase comparator is not suitable to process TV horizontal scan signals because, in that case, the signal Fref may have many spurious pulses.

Moreover, to obtain a sufficiently accurate phase comparator, the clock signal CK must have a substantially high frequency. For example, for a TV horizontal scan, the frequency of signal CK must be approximately 200 MHz. Common technologies do not allow to realize such a fast up/down counter.

SUMMARY OF THE INVENTION

An object of the present invention is to provide a digital phase comparator capable of operating at a particularly high clock frequency.

A further object of the present invention is to realize a digital phase comparator that is little sensitive to spurious pulses.

To achieve these objects, the present invention provides a digital phase comparator supplying digital values corresponding to the phase shifts between a first signal having a duty cycle of approximately 0.5 and a second signal. The phase comparator includes a one-way counter initialized at the frequency of the first signal and clocked by a clock signal having a high frequency with respect to the frequency of the first and second signals. A logic gate enables the counter when the first and second signals are in respective predetermined states. A phase shift is considered to be zero when it corresponds approximately to one half of the counter's capacity.

According to an embodiment of the invention, the digital phase comparator includes a flip-flop cooperating with the logic gate to enable the counter only when a predetermined edge of the second signal occurs when the first signal is at its respective predetermined state.

According to an embodiment of the invention, the phase comparator includes a processing circuit for decreasing the duration of the respective predetermined state of the first signal by the duration corresponding to the counter counting up to half its capacity.

According to an embodiment of the invention, the phase comparator includes a clock generator providing a plurality of clock signals having the same frequency but that are shifted by a constant value. The clock signals are successively provided to the counter at the frequency of the first signal.

The foregoing and other objects, features, aspects and advantages of the invention will become apparent from the following detailed description of the present invention when taken in conjunction with the accompanying drawings.

DETAILED DESCRIPTION

Figure 3A:
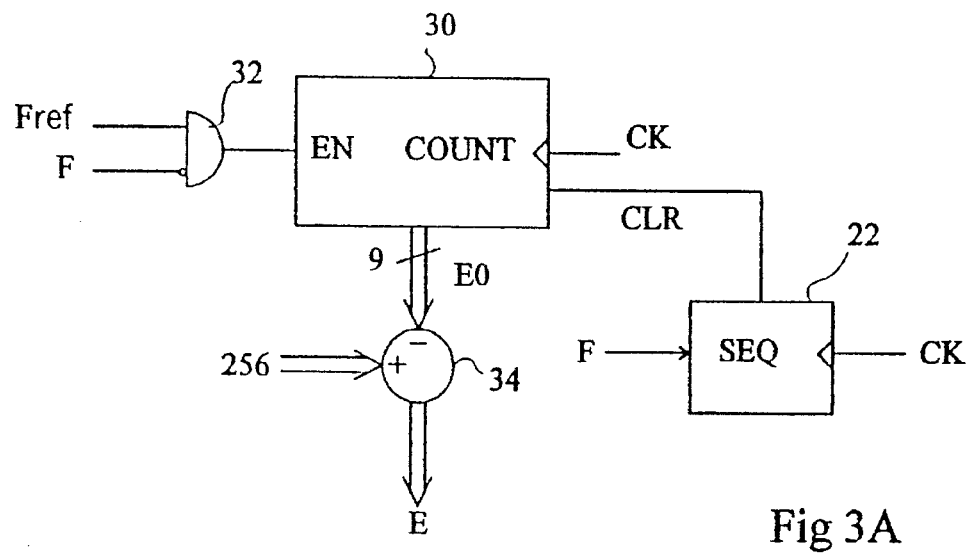
FIG. 3A is a block diagram of an embodiment of a digital phase comparator according to the present invention.

As represented in FIG. 3A, a digital phase comparator according to the present invention has a one-way counter 30 which has the advantage, if it is asynchronous, of operating with clock frequencies CK as high as approximately 200 MHz in present common technologies (which is not the case for the up/down counters). At an enable input EN, counter 30 receives the output of an AND gate 32 which receives at one input the signal Fref and at another input the complement of signal F.

With this configuration, the enable signal EN provided by AND gate 32 is sensitive to the states of signals Fref and F, but is insensitive to their rising or falling edges. If one of the signals Fref or F has a spurious pulse, the enable signal EN is active only during the width of the spurious pulse and the content of counter 30 varies very little. Counter 30 is periodically reset by a signal CLR provided by a sequencer 22 receiving signals F and CK.

The content E0 of counter 30, which is, for example, a 9-bit number, is subtracted from a constant value (256) corresponding to one half of the capacity of counter 30 by a subtracter 34 that provides the digital phase error E.

Figure 1:
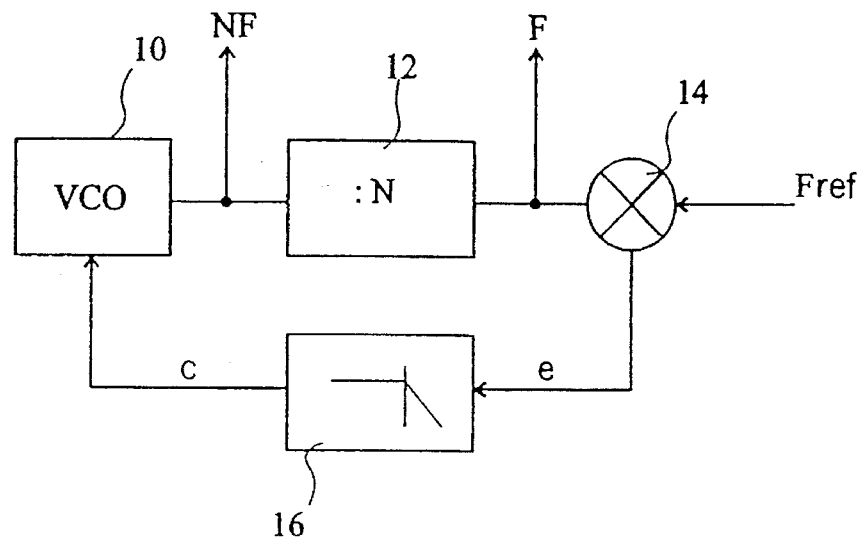
FIGS. 1 and 2 are block diagrams of a conventional phase-locked loop (PLL) and a conventional digital phase comparator, respectively.
Figure 2:
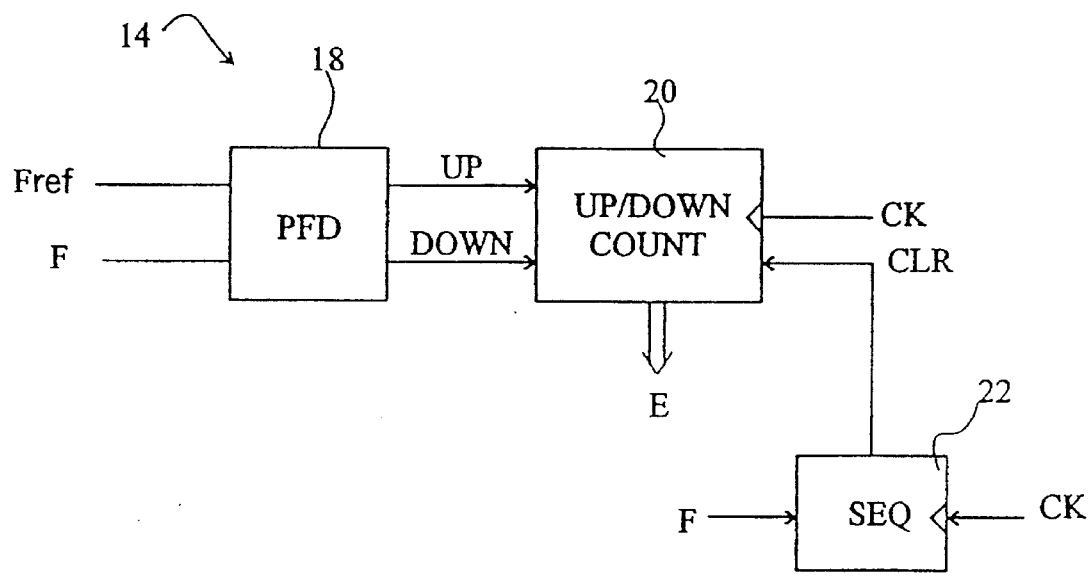
Figure 3B:
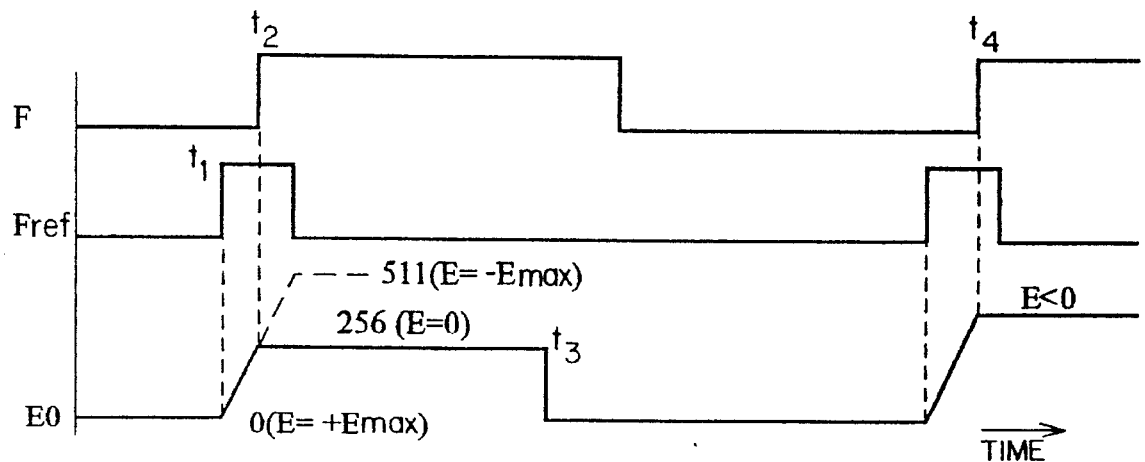
FIG. 3B is a timing diagram of signals used in the phase comparator of FIG. 3A.

FIG. 3B illustrates an exemplary waveform of signals F and Fref and the corresponding variation of the content E0 of counter 30. The signal F, provided by divider 12 (FIG. 1) of a PLL, has a duty cycle of 0.5. In TV horizontal scan circuitry, signal Fref corresponds to synchronization pulses having a width (approximately 4.7 microseconds) that is assumed to be constant. The frequency of clock CK is selected so that the counter counts up to its maximum value (511) during the occurrence of a pulse of signal Fref. Thus, if a pulse of signal Fref is centered on a rising edge of signal F, the counter reaches a value (256) equal to one half of its capacity. This half value is selected so as to correspond to a zero phase error: the rising edges of signal F are synchronized with the pulse centers of signal Fref.

At time $t_1$, a rising edge of a pulse of signal Fref occurs. The counter 30, initially at zero, is enabled and starts to count.

At time $t_2$, corresponding in this example to the pulse center of signal Fref, a rising edge of signal F occurs. The counter 30 is stopped at half of its capacity 256. This value is maintained until time $t_3$ to allow a digital filter 16 (FIG. 1) to process the obtained value e (in this example, E=0).

At time $t_3$, sequencer 22 resets counter 30. Time $t_3$ occurs before the next rising edge of signal F.

If time $t_2$ occurs before time $t_1$, counter 30 remains at zero, which corresponds to a maximum positive error +Emax (phase lead of signal F with respect to signal Fref).

If time $t_2$ occurs after the falling edge of the pulse of signal Fref, the counter 30 reaches its maximum value 511 which corresponds to a maximum negative phase error −Emax (phase lag of signal F with respect to signal Fref).

If time $t_2$ occurs at an arbitrary time during the pulse Fref, counter 30 is set at a value between zero and its maximum value. This value corresponds to a phase error E that is proportional to the effective phase error. For example, at time $t_4$, a rising edge of signal F occurs shortly before the end of a pulse of signal Fref. The counter 30 reaches a value close to 511 corresponding to a phase error E that is negative and proportional to the effective phase error.

Figure 4:
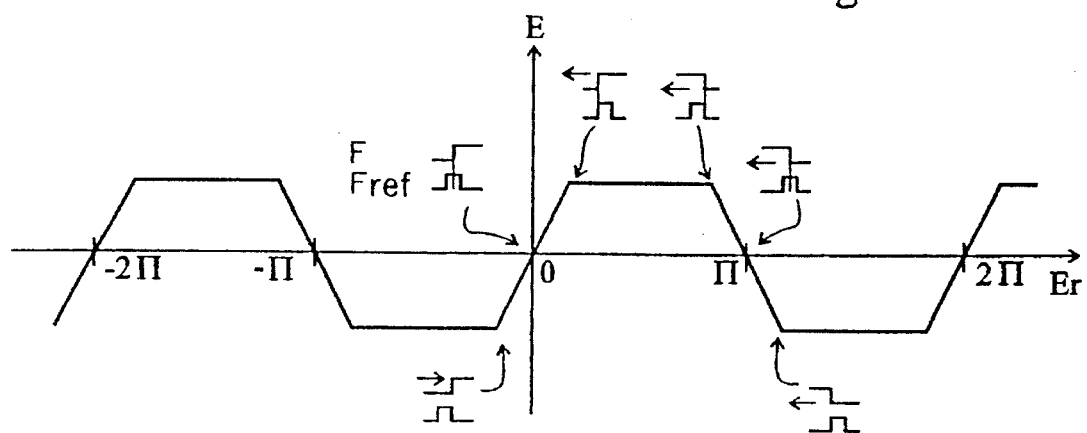
FIG. 4 is a diagram of an error provided by the phase comparator of FIG. 3A as a function of an effective error.

FIG. 4 is a diagram of the phase error E provided by the phase comparator of FIG. 3A as a function of the effective phase error Er. This diagram is symmetric with respect to the origin of the diagram. About value 0, error E varies proportionally to the effective error Er. Beyond this linear portion, error E saturates at its maximum positive value or at its maximum negative value.

To facilitate the understanding of the diagram, an edge corresponding to signal F and a corresponding pulse of signal Fref are represented at the key points of this diagram.

It will be noted that the diagram has linear portions with negative slopes about abscissae $\pi$ and $-\pi$. This is due to the fact that the counter 30 is also enabled when the end of a pulse of signal Fref occurs after a falling edge of signal F, as indicated in the diagram of FIG. 4. Ideally, the transition is abrupt at abscissae $\pi$ and $-\pi$. However, these linear portions at abscissae $\pi$ and $-\pi$ will not cause a PLL to misfunction if the pulses of signal Fref have a constant width and correspond to the time required by the counter 30 to count up to its maximum value (511).

If a digital phase comparator according to the invention is used in a PLL of TV horizontal scan circuitry, the linear portions correspond only to approximately 4.7 microseconds with respect to the 64 microseconds of a period of signal Fref. This could lead those skilled in the art to presume that the PLL cannot converge if signal F is initially arbitrary.

Indeed, when signal F is arbitrary, one could think that the pulse centers of signal Fref have as many chances to occur when signal F is at 1 as when signal F is at zero, which would involve that the phase of signal F would be corrected as many times in the negative direction as in the positive direction with an average zero correction.

Figure 5:
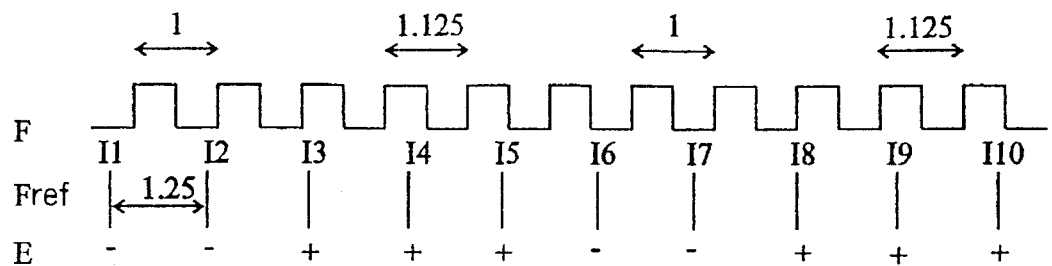
FIG. 5 illustrates signals at the initialization of the comparator of FIG. 3A.

FIG. 5 is intended to show that such a PLL finally converges. The period of signal F is initially equal to 1. The period of signal Fref is constant and equal to 1.25. The pulse centers of signal Fref are represented by vertical bars I1, I2 .... The corresponding sign of error E is represented beneath each vertical bar.

Filter 16 is of the integral and proportional correction type. The time constant of filter 16 is particularly high, which involves that the integral correction occurs in the long run, when a high number of phase errors having a same sign have been provided. Therefore, to simplify, it can be assumed that this integral correction does not occur. In addition, it is also assumed that the phase error values are maximum, which is almost true since there is a high probability, when signal F is arbitrary, that the pulse centers of signal Fref occur within the saturation ranges of FIG. 4.

With these assumptions, filter 16 acts upon oscillator 10, which is a frequency synthesizer in PLLs that are entirely digital, to cause the period of signal F to be corrected by a (low) constant value in the same direction as the phase error E, the correction occurring, for example, at the rising edge of signal F following the error measurement.

Pulses I1 an I2 occur when signal F is at zero. The corresponding errors E are negative. At the rising edge following pulse I1, the period of signal F is set to 1 whereas it was formerly slightly higher. The period of signal F is maintained at 1 as long as the phase error is negative.

Pulse I3 occurs when signal F is at 1. The corresponding error E is positive. This pulse I3 is quite close to a preceding rising edge of signal F. If the period of signal F had not been decreased pulse I3 might have occurred when signal F was at 0 and might have provided a negative error E. The period of signal F increases from 1 to 1.125 at the rising edge of signal F following the pulse I3.

Pulses I4 and I5 also occur when signal F is at 1. The corresponding error is positive and signal F keeps its period of 1.125. The pulse I5 occurs immediately before a falling edge of signal F. If the period of signal F had not been increased, pulse I5 might have occurred when signal F was at 0 and might have provided a negative error.

The pulses I6 and I7 occur when signal F is at 0, the corresponding error E is negative and the period of signal F becomes 1 at the rising edge following pulse I6.

Pulses I8–I10 occur when signal F is at 1, and the period of signal F is again set to 1.125 at the rising edge following pulse I8.

It will be noted in this specific example that most (3/5) errors E have a positive sign and correct the period of signal F in the right direction. This is due, in the example of FIG. 5, to the following combined effect. First, during negative corrections, the period of signal F is decreased; since the period of signal Fref is greater than the period of signal F, the probability that the next pulse of signal Fref occurs within a range (signal F at 0) in which a negative error is detected is reduced. Second, during positive corrections, the period of signal F is increased; since the period of signal Fref is greater than the period of signal F, this increases the probability that the next pulse of signal Fref occurs within a range (signal F at 1) in which a positive error is detected.

Of course, similar reasoning applies to the case where the period of signal F is initially greater than the period of signal Fref.

Accordingly, over a large number of periods, more corrections in the right direction are obtained than corrections in the wrong direction and the PLL finally converges due to the presence of the integrating filter.

Figure 6:
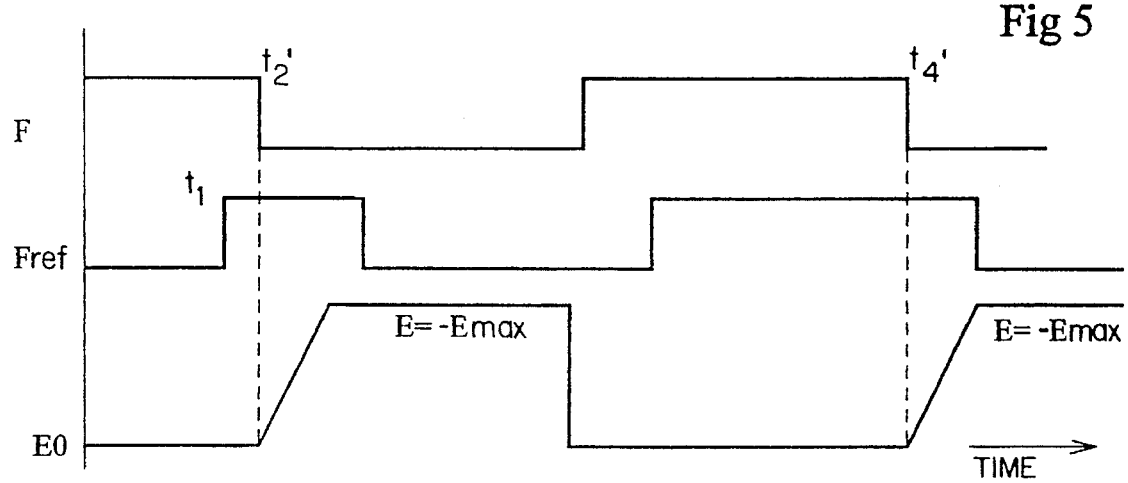
FIG. 6 is a timing diagram of a defective operation of the comparator of FIG. 3A in the particular case where one of its input signals has a variable duty cycle.

FIG. 6 illustrates an example where the pulses of signal Fref have an arbitrary width, and in any case greater than the width corresponding to counter 30 counting up to its maximum value. In this case, the phase comparator of FIG. 3 erroneously operates in some cases.

At time $t_1$, a rising edge of a pulse of signal Fref occurs. At time $t_2$, after time $t_1$, a falling edge of signal F occurs. The counter of FIG. 3A is enabled and starts to count. Counter 30 counts as long as signal Fref is at 1. If the pulse of signal Fref lasts longer than its normal value, as represented in FIG. 6, the content E0 reaches its maximum value corresponding to an error E equal to the maximum negative value −Emax. The phase comparator indicates a maximum phase lag of signal F whereas, in the example of FIG. 6, the signal is in phase lead. This error is due to the fact that, at the occurrence of a falling edge of signal F, the width or the end of a pulse of signal Fref is measured, which is not indicative of a phase error.

More generally, this type of error is liable to occur when the pulses of signal Fref are of greater width than that corresponding to counter 30 counting up to its maximum value. This error is then liable to occur, as represented at the right in FIG. 6, in a common case (different from the scanning in a television set) where both signals F and Fref have a duty cycle equal to 0.5. In such a case, a phase comparator according to the invention synchronizes the rising edges of signal F with a predetermined position at the beginning of portions at 1 of signal Fref, and not with the center of those portions. This case is particularly impairing because a maximum lag of signal F may be detected, as represented, whereas signal F is merely slightly in phase lead.

Figure 7:
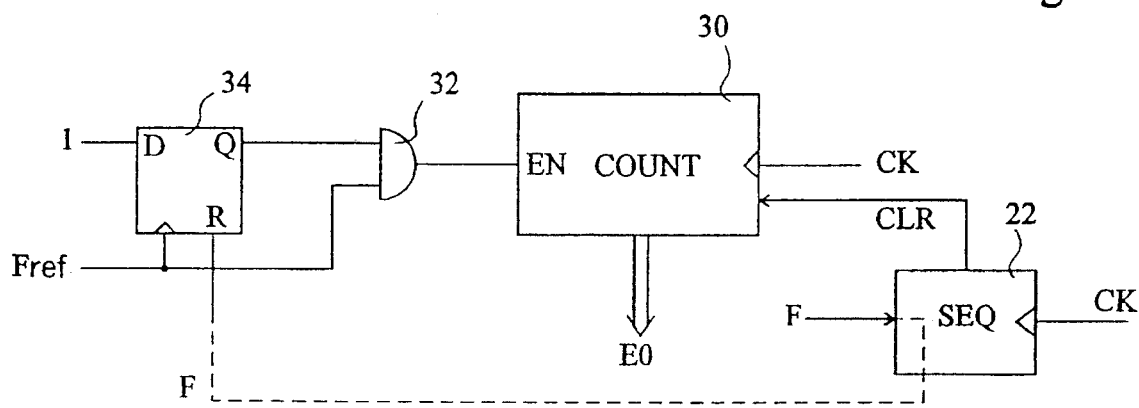
FIG. 7 is a block schematic diagram of an embodiment of a digital phase comparator according to the present invention avoiding the drawback of FIG. 6.

FIG. 7 illustrates an embodiment of a digital phase comparator according to the invention that avoids the above-noted drawback. A gate 32 receives, instead of the complement of signal F, the output Q of a flip-flop 34. The data input D of flip-flop 34 receives the value 1, the clock input receives signal Fref, and the reset input R receives signal F. With this configuration, counter 30 is enabled only when a rising edge of signal Fref occurs while signal F is at 0. This avoids the erroneous counting steps of FIG. 6.

Figure 8:
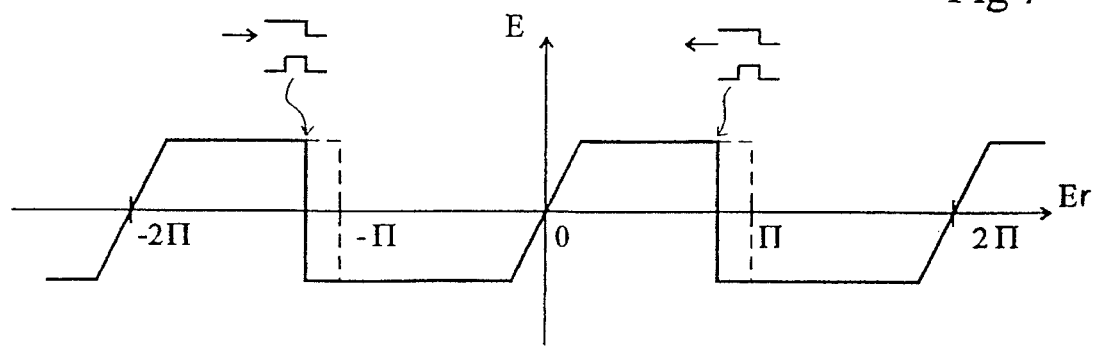
FIG. 8 is a timing diagram of the phase error provided by the phase comparator of FIG. 7 as a function of the effective phase error.

FIG. 8 is a diagram obtained with the comparator of FIG. 7 of the error E that is provided as a function of the effective error Er. This diagram is not symmetric and has an abrupt transition at the points where a falling edge of signal F occurs at the same time as a falling edge of signal Fref (before abscissae −π and π).

However, the drawback of such an asymmetry is to increase the probability of detecting negative errors with respect to the probability of detecting positive errors. There is a risk that the convergence of a PLL may no longer be ensured.

To avoid this drawback, the diagram is made symmetric, as represented in dotted lines, by decreasing the duration at 0 of signal F by the duration corresponding to counter 30 counting up to one half of its capacity. This can be done, for example, as represented in FIG. 7, by processing signal F in the sequencer 22 before it is provided to the flip-flop 34 to delay its falling edges by 256 periods of the clock CK (in the example where the maximum value of counter 30 is 511).

The resolution of the phase comparator described hitherto is of one period of clock CK, that is, in steady state, the value of the phase error oscillates between −1 and +1. The average resolution of the comparator can be improved with the configuration described hereinafter.

Figure 9A:
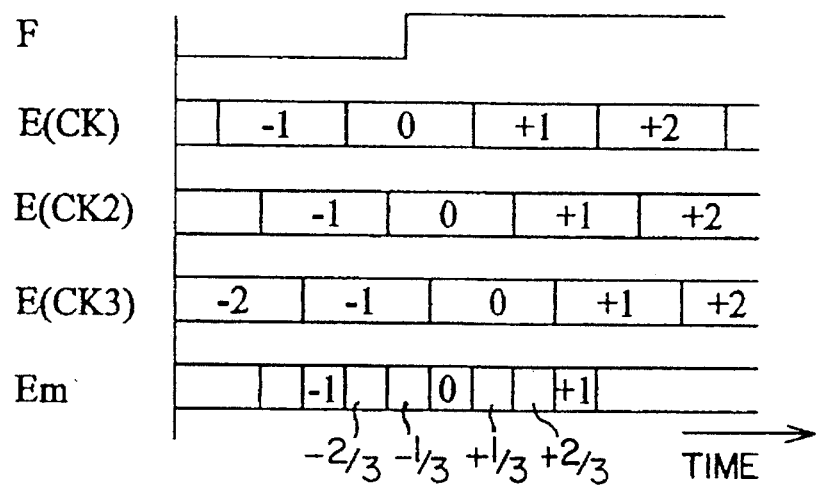
FIGS. 9A and 9B are a diagram and a block diagram of an alternative embodiment of a digital phase comparator according to the present invention.
Figure 9:
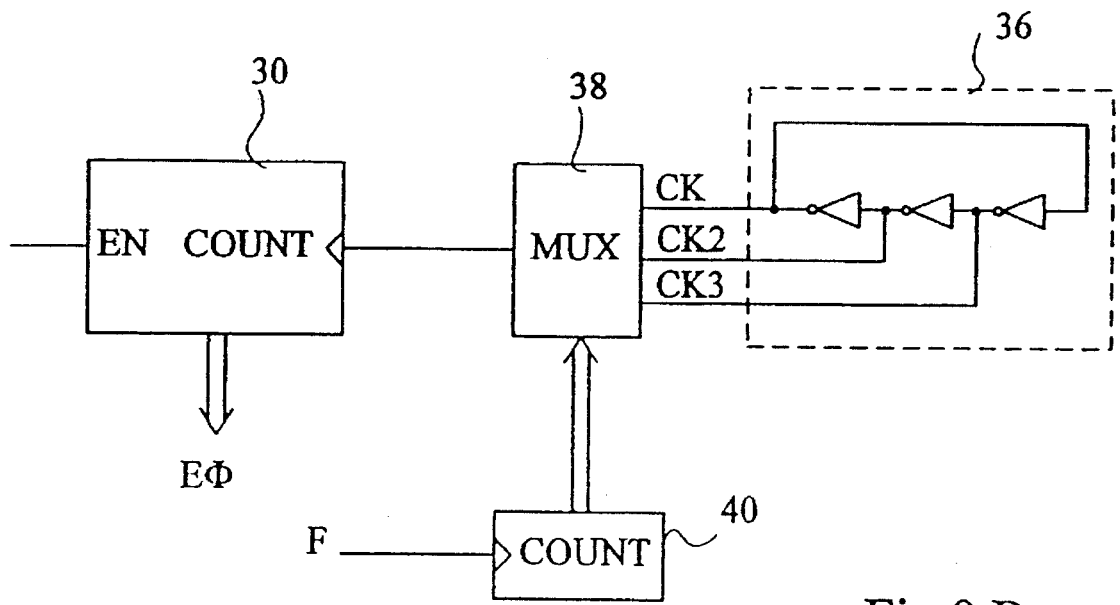

FIG. 9A illustrates the steady state operation of a PLL including a phase comparator according to the invention. The result E(CK) provided by the comparator can be symbolized with a graduated ruler . . . −1, 0, +1, +2 . . . . The value provided as a phase error E corresponds to the graduation at which a rising edge of signal Fref occurs. In the given example, a rising edge of signal Fref occurs at graduation 0, which provides a phase error 0. However, the frequency of signal F is never exactly the desired frequency, and the rising edge varies about 0 along the ruler, so that the provided errors tend to oscillate between −1 and +1.

The invention increases the mean accuracy of the errors E provided by the phase comparator. To achieve this purpose, for example, three rulers are used, namely, the above ruler E(CK) and additional rulers E(CK2) and E(CK3) that are shifted one with respect to the preceding by one third of a graduation. These rulers are cyclically used to provide the error E. In the given example, the first ruler provides value 0, the second ruler also provides value 0, but the third ruler provides value −1. Accordingly, if signal F remains steady, the phase comparator provides value −1 every three periods, which corresponds to a mean phase error of −⅓.

A ruler Em, corresponding to the mean phase errors obtained every three periods of signal F, is represented beneath ruler E(CK3).

FIG. 9B represents an embodiment of a phase comparator according to the invention increasing the accuracy of the comparator as described above. An oscillator 36 provides three clock signals CK, CK2, CK3 which have the same frequency and are shifted by one third of the period one with respect to the other. Oscillator 36 is, for example, a ring oscillator including three inverters whose outputs provide signals CK, CK2, and CK3, respectively. A multiplexer 38 receives these three clock signals and provides counter 30 with only one of them. The clock signal to be provided is selected by a divide-by-3 counter 40 clocked by signal F.

As is apparent to those skilled in the art, various modifications can be made to the above disclosed preferred embodiment, both for the values used in the above example and for the implementation of elements whose function has been described and that can be replaced with other elements having the same function.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A digital phase comparator for providing digital values corresponding to phase shifts between a first signal and a second signal, the comparator comprising:

a one-way counter having a capacity and being initialized at the frequency of the first signal, the counter being clocked by a clock signal having a high frequency relative to the frequency of the first and second signals;

a logic gate for receiving the first and second signals and coupled to the counter for providing an enabling signal to the one-way counter when the first and second signals are in respective predetermined states; and a flip-flop coupled to the logic-gate so that the enabling signal is provided to the one-way counter only when a predetermined edge of the second signal occurs when the first signal is at its respective predetermined state.

2. The comparator of claim 1, further including a processing circuit for decreasing a duration of the respective predetermined state of the first signal by a duration corresponding to the time for the one-way counter to count to half of the capacity.

3. The comparator of claim 1, further including a clock generator coupled to the one-way counter for providing a plurality of clock signals having the same frequency but shifted by a constant value, the clock signals being successively provided to the one-way counter at the frequency of the first signal.

4. The comparator of claim 1, wherein the duty cycle of the first signal is about 0.5.

5. The comparator of claim 1, wherein, a phase shift is considered to be zero when the phase shift corresponds to about half of the capacity of the counter.

6. The comparator of claim 1, wherein the duty cycle of the first signal is about 0.5.

7. The comparator of claim 1, wherein the frequency of the first signal is at least about 15 kHz.

8. The comparator of claim 7, wherein the frequency of the clock signal is at least about 200 MHz.

9. A digital phase comparator for providing digital values corresponding to phase shifts between a first signal and a second signal, the comparator comprising:

a one-way counter having a capacity and being initialized at the frequency of the first signal, the counter being clocked by a clock signal having a high frequency relative to the frequency of the first and second signals;

a logic gate for receiving the first and second signals and coupled to the counter for providing an enabling signal to the one-way counter when the first and second signals are in respective predetermined states; and a clock generator coupled to the one-way counter for providing a plurality of clock signals having the same frequency but shifted by a constant value, the clock signals being successfully provided to the one-way counter at the frequency of the first signal.

10. The comparator of claim 6, wherein the duty cycle of the first signal is about 0.5.

11. A digital phase comparator for providing digital values corresponding to phase shifts between a first signal and a second signal, the comparator comprising:

means, clocked by a clock signal having a high frequency relative to the frequency of the first and second signals, for counting in response to an enabling signal;

means for receiving and logically combining the first and second signals and for providing an enabling signal to the counting means when the first and second signals are in respective predetermined states; and means, coupled to the logic gate, for enabling the counting means only when an edge of the second signal occurs when the first signal is at its respective predetermined state.

12. The comparator of claim 11, further including means for decreasing the count of the respective predetermined state of the first signal by a duration corresponding to a duration for the counting means to count to half of its capacity.

13. The comparator of claim 11, further including means, coupled to the counting means, for providing a plurality of clock signals having the same frequency but shifted by a constant value, said clock signals being successively provided to the counting means at the frequency of the first signal.

14. The comparator of claim 11, wherein the first signal has a duty cycle of about 0.5.

15. The comparator of claim 11, wherein the frequency of the clock signal is at least about 200Mhz.

16. A digital phase comparator for providing digital values corresponding to phase shifts between a first signal and a second signal, the comparator comprising:

means, clocked by a clock signal having a high frequency relative to the frequency of the first and second signals, for counting in response to an enabling signal;

means for receiving and logically combining the first and second signals and for providing an enabling signal to the counting means when the first and second signals are in respective predetermined states; and means for providing a plurality of clock signals having the same frequency but shifted by a constant value, the clock signals being successively provided to the counting means at the frequency of the first signal.

17. A digital phase comparator for providing digital values corresponding to phase shifts between a first signal and a second signal, the comparator comprising:

means, clocked by a clock signal having a high frequency relative to the frequency of the first and second signals, for counting in response to an enabling signal;

means for receiving and logically combining the first and second signals and for providing an enabling signal to the counting means when the first and second signals are in respective predetermined states; and means for subtracting a constant value from the output of the counting means so that a phase shift is considered to be zero when the phase shift corresponds to about half of the capacity of the counting means.

18. A circuit for processing horizontal television scans comprising:

a first input lead for receiving a reference signal;

a second input lead for receiving a horizontal scan signal;

a digital phase comparator coupled to the first and second input leads for receiving the reference signal and the horizontal scan signal and for providing digital values corresponding to phase shifts between the reference signal and the horizontal scan signal, the comparator including:

a one-way counter having a capacity and being initialized at the frequency of the horizontal scan signal, the counter being clocked by a clock signal having a high frequency relative to the frequency of the reference signal and the horizontal scan signal; and a logic gate for receiving the reference signal and the horizontal scan signal and coupled to the counter for providing an enabling signal to the one-way counter when the reference and horizontal scan signals are in respective predetermined states; and a flip-flop coupled to the logic gate for enabling the counter only when a predetermined edge of the horizontal scan signal occurs when the reference signal is at its respective predetermined state.

19. The circuit of claim 18, wherein the horizontal scan signal has a frequency of about 15kHz.

20. The circuit of claim 18, further including a clock generator coupled to the counter for providing a plurality of clock signals having the same frequency but shifted by a constant value, the clock signals being successively provided to the counter at the frequency of the reference signal.

21. A circuit for processing horizontal television scans comprising:

first input lead for receiving a reference signal;

a second input lead for receiving a horizontal scan signal;

a digital phase comparator coupled to the first and second input leads for receiving the reference signal and the horizontal scan signal and for providing digital values corresponding to phase shifts between the reference signal and the horizontal scan signal, the comparator including:

a one-way counter having a capacity and being initialized at the frequency of the horizontal scan signal, the counter being clocked by a clock signal having a high frequency relative to the frequency of the reference signal and the horizontal scan signal; and a logic gate for receiving the reference signal and the horizontal scan signal and coupled to the counter for providing an enabling signal to the one-way counter when the reference and horizontal scan signals are in respective predetermined states; and a processing circuit for decreasing the duration of the respective predetermined state of the reference signal by a duration corresponding to a duration for the counter to count to half of its capacity.

22. A circuit for processing horizontal television scans comprising:

a first input lead for receiving a reference signal;

a second input lead for receiving a horizontal scan signal;

a digital phase comparator coupled to the first and second input leads for receiving the reference signal and the horizontal scan signal and for providing digital values corresponding to phase shifts between the reference signal and the horizontal scan signal, the comparator including:

a one-way counter having a capacity and being initialized at the frequency of the horizontal scan signal, the counter being clocked by a clock signal having a high frequency relative to the frequency of the reference signal and the horizontal scan signal; and a logic gate for receiving the reference signal and the horizontal scan signal and coupled to the counter for providing an enabling signal to the one-way counter when the reference and horizontal scan signals are in respective predetermined states; and a clock generator coupled to the counter for providing a plurality of clock signals having the same frequency but shifted by a constant value, the clock signals being successively provided to the counter at the frequency of the reference signal.

23. A circuit for processing horizontal television scans comprising:

a first input lead for receiving a reference signal;

a second input lead for receiving a horizontal scan signal;

a digital phase comparator coupled to the first and second input leads for receiving the reference signal and the horizontal scan signal and for providing digital values corresponding to phase shifts between the reference signal and the horizontal scan signal, the comparator including:

a one-way counter having a capacity and being initialized at the frequency of the horizontal scan signal, the counter being clocked by a clock signal having a high frequency relative to the frequency of the reference signal and the horizontal scan signal; and a logic gate for receiving the reference signal and the horizontal scan signal and coupled to the counter for providing an enabling signal to the one-way counter when the reference and horizontal scan signals are in respective predetermined states; and means for subtracting a constant value from the output of the counter so that a phase shift is considered to be zero when the phase shift corresponds to about half of the capacity of the counter.

24. A method for providing digital values corresponding to phase shifts between a first signal and a second signal, the method comprising the steps of:

receiving and logically combining the first and second signals;

providing an enabling signal when the first and second signals are in respective predetermined states; and counting, in response to the enabling signal, with a one-way counter, the counter being clocked by a clock signal having a high frequency relative to the frequency of the first and second signals;

wherein the step of providing includes the step of providing the enabling signal only when an edge of the second signal occurs when the first signal is in its respective predetermined state.

25. The method of claim 24, wherein the first signal has a duty cycle of about 0.5.

26. The method of claim 24, wherein the frequency of the clock signal is at least about 200Mhz.

27. A method for providing digital values corresponding to phase shifts between a first signal and a second signal, the method comprising the steps of:

receiving and logically combining the first and second signals;

providing an enabling signal when the first and second signals are in respective predetermined states;

counting, in response to the enabling signal, with a one-way counter, the counter being clocked by a clock signal having a high frequency relative to the frequency of the first and second signals; and receiving, by the one-way counter, a plurality of clock signals having the same frequency but shifted by a constant value, the clock signals being successively received at the frequency of the first signal.

28. A method for providing digital values corresponding to phase shifts between a first signal and a second signal, the method comprising the steps of:

receiving and logically combining the first and second signals;

providing an enabling signal when the first and second signals are in respective predetermined states;

counting, in response to the enabling signal, with a one-way counter, the counter being clocked by a clock signal having a high frequency relative to the frequency of the first and second signals; and subtracting a constant value from the output of the counter so that a phase shift is considered to be zero when the phase shift corresponds to about half of the capacity of the counter.

* * * * *